United States Patent [19]

Ichihara

[11] Patent Number: 5,196,806
[45] Date of Patent: Mar. 23, 1993

[54] OUTPUT LEVEL CONTROL CIRCUIT FOR USE IN RF POWER AMPLIFIER

[75] Inventor: Masaki Ichihara, Tokyo, Japan

[73] Assignee: NEC Corporation, Tokyo, Japan

[21] Appl. No.: 779,879

[22] Filed: Oct. 21, 1991

[30] Foreign Application Priority Data

Oct. 19, 1990 [JP] Japan .................................. 2-279440
Oct. 22, 1990 [JP] Japan .................................. 2-281782

[51] Int. Cl.$^5$ .......................................... H03G 3/20
[52] U.S. Cl. .................... 330/137; 330/279; 375/60; 375/71; 455/89; 455/126; 455/127
[58] Field of Search ............... 330/127, 129, 134, 137, 330/279; 455/89, 116, 126, 127; 375/98, 60, 71

[56] References Cited

U.S. PATENT DOCUMENTS 4,066,965 1/1978 Schultz et al. ................... 455/126 X Primary Examiner—James B. Mullins
Attorney, Agent, or Firm—Sughrue, Mion, Zinn, Macpeak & Seas

[57] ABSTRACT

An output level control circuit for a high frequency power amplifier for amplifying high frequency signals having the "on" and "off" periods of transmit signals in a fixed recurrent cycle such as in a TDMA radio communication system or a GSM system. The high frequency detecting circuit for the output level control circuit is responsive to part of the output of the high frequency power amplifier and a control signal corresponding to said "on" and "off" periods of transmission power for generating an output level control signal for the high frequency power amplifier. The high frequency detecting circuit has detecting means for detecting the wave height of the high frequency signals and differential voltage generating means for generating, for each of said recurrent cycles, a differential voltage between the detection output during the "on" period and the detection output during the "off" period immediately preceding it. This differential voltage is used as the temperature-compensated output level control signal for the high frequency power amplifier.

14 Claims, 3 Drawing Sheets

OUTPUT LEVEL CONTROL CIRCUIT FOR USE IN RF POWER AMPLIFIER

BACKGROUND OF THE INVENTION

The present invention relates to an output level control circuit for use in a high frequency or radio frequency (RF) power amplifier, and more particularly to a control circuit of this kind suitable for use in the RF power amplifier of a transmitter in a communication system using RF signals having a plurality of intermittent and selectable output levels as in a TDMA radio communication system or a digital cellular mobile or Groupe Speciale Mobile (GSM) telephone system.

In order to maintain the transmitting power of a radio communication system at a prescribed level, there are needed an RF power signal level detecting circuit (hereinafter referred to simply as an RF detecting circuit) for detecting the level of the RF signal and a circuit responsive to the output of the RF detecting circuit for controlling a power amplifier. Especially in order to precisely keep the transmitting power at one of a plurality of prescribed levels over a broad temperature range, the RF detecting circuit is required to precisely detect, preferably without distorting linearity, the RF power level throughout the wide dynamic range of the transmitting power and, moreover, over a broad temperature range.

The RF detecting circuits described in "A Temperature Stabilized RF Detector with Extended Dynamic Range", R. J. Turner, 32nd IEEE Vehicular Technology Conference Record, May 23-26, 1982, pp. 231-242 and U.S. Pat. No. 4,523,155 (issued Jun. 1, 1985) are intended to satisfy the aforementioned requirements, and are applicable not only to such intermittent RF signals as mentioned above but also to consecutive RF signals. Any such a conventional circuit requires two diodes including a detecting diode responsive to the envelope of RF signal for generating an output and a temperature compensating diode having the same characteristics as and thermally coupled with the detecting diode. In that circuit, the two diodes are provided with the same forward bias voltage, and the difference between the load voltage of the detecting diode and that of the temperature compensating diode is used as the detection output of the RF power level. Since this detection output is obtained by subtracting the forward voltage of the temperature compensating diode from that of the detecting diode, any variation in the latter with a change in temperature is cancelled by a corresponding variation in the former. Therefore, the prior art RF detecting circuit can generate detection output voltages substantially proportional to the RF signal level without being affected by temperature fluctuations.

It is difficult, however, for such an RF detecting circuit to keep the biases of the two diodes at the same level over a broad temperature range because uneven characteristics of the circuit elements used, especially differences between the detecting and temperature compensating diodes in forward voltage and temperature characteristic and uneven resistances of bias voltage supplying resistors and load resistors, are inevitable. Moreover, the two diodes are usually arranged as separate parts to enable them to sensitively detect RF signals, and accordingly it may be difficult to install them thermally coupled in locations having the same temperature conditions. For these reasons, there remains in the detection output voltage a variant due to temperature variations. Further in order to compensate for the uneven characteristics of circuit elements, fine adjustments are required, including the offsetting of the bias voltages of the two diodes. Besides these problems, because of the need to constitute the two diodes by separate parts, it is difficult to wholly integrate the RF detecting circuit and the power amplifier control circuit for the purpose of reducing their cost and size.

SUMMARY OF THE INVENTION

An object of the present invention is, therefore, to provide an output level control circuit for precisely keeping an RF power amplifier which transmits intermittent RF signals at a selected one of a plurality of prescribed output levels, at each of the output levels over a broad temperature range.

Another object of the invention is to provide an RF detecting circuit, constituting a principal part of the output level control circuit, for detecting all of the plurality of output levels with sufficient accuracy over the broad temperature range.

Yet another object of the invention is to provide an RF power amplifier placed under temperature compensation and having a broad dynamic range.

A further object of the invention is to provide an RF detecting circuit suitable for integration.

According to the present invention, there is provided an RF detecting circuit suitable for controlling an RF power amplifier for intermittently sending out RF power in a burst form as in the GSM cellular mobile telephone system. The RF detecting circuit comprising a detector including a detecting diode for generating a detection output corresponding to the RF signal level taken out from the output side of the RF power amplifier by a directional coupler as part of the output of the power amplifier, and a sample hold circuit for sampling-holding the detection output while the output of the RF power amplifier is off. The sampled-held voltage and the detection output are entered into a subtractor, which generates an output corresponding to the RF signal level by subtracting the former from the latter. Since the detection output and hold voltage are detected by detectors having substantially the same characteristics as stated above and the detection the same characteristics as stated above and the detection output during the "off" period of the output of the RF power amplifier is subtracted by the subtractor from the detection output for one on/off cycle of the output of the power amplifier, any variation in the detection output with temperature fluctuation is cancelled by this subtraction. As stated above, the detection output during the "on" period of the output of RF power amplifier is corrected by the detection output of the "off" period immediately preceding that "on" period and is cleared of any variation due to temperature fluctuation, so that the output of the subtractor faithfully represents the output of RF power amplifier over a broad temperature range. As a bias voltage about equal to the forward voltage is applied to the detecting diode, the RF detecting circuit is able to achieve linear detection, resulting in improved linearity of the RF signal level versus the RF signal level and a broader dynamic range of RF detection compared with the case in which no bias voltage is applied.

BRIEF DESCRIPTION OF THE DRAWINGS

The above-mentioned and other objects, features and advantages of the present invention will become more apparent from the following detailed description when taken in conjunction with the accompanying drawings, wherein.

DETAILED DESCRIPTION OF THE PREFERRED EMBODIMENT

Figure 1:
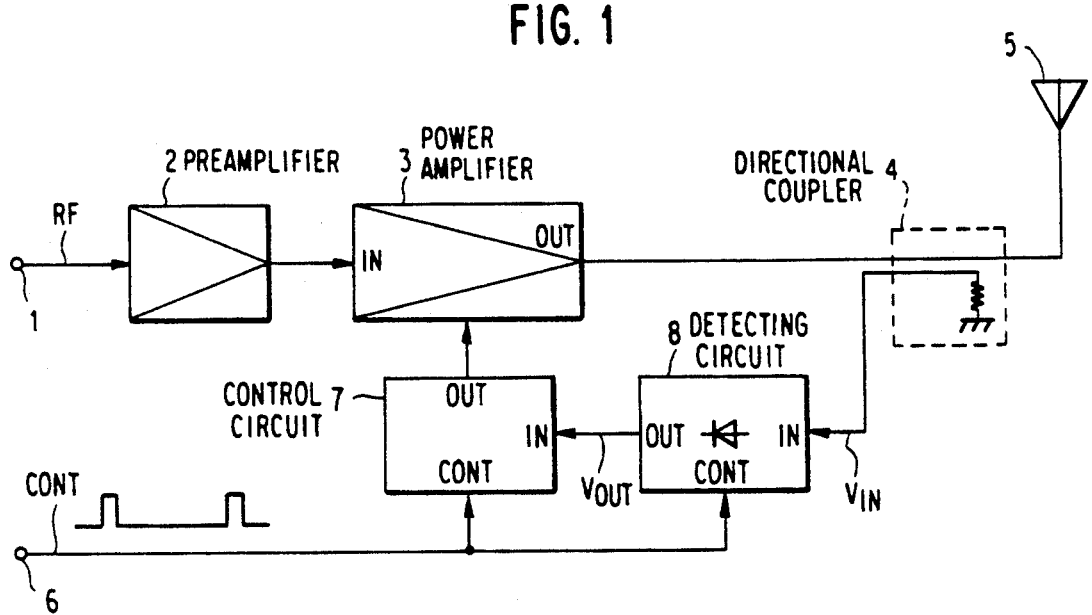
FIG. 1 is a block diagram illustrating one example of transmitter for use in the TDMA or GSM system, embodying the invention.
Figure 2:
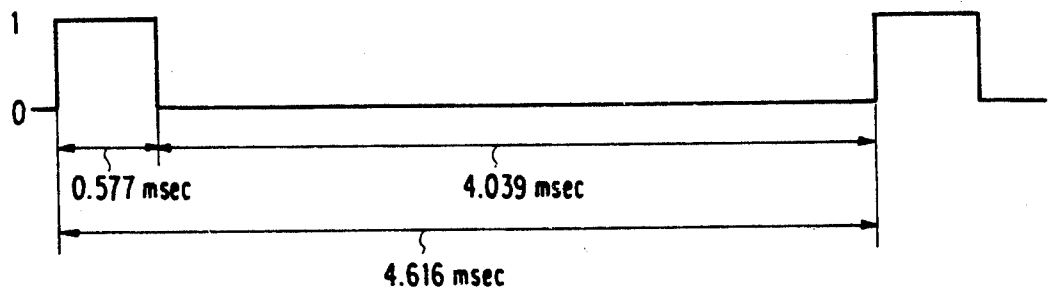
FIG. 2 is a waveform diagram of the control signal to be supplied to the power amplifier of the transmitter shown in FIG. 1.

Referring to FIGS. 1 and 2, a transmitter for a radio communication apparatus for use in the TDMA or GSM system, embodying the present invention, includes a preamplifier 2 for amplifying a transmit signal RF of the TDMA/GSM system supplied to an input terminal 1, a power amplifier 3 for amplifying the output of preamplifier 2, and a directional coupler 4 for leading the power-amplified transmit signal RF in a burst from to an antenna 5. A high frequency signal Vin, which is part of the output of the power amplifier 3, is supplied from the directional coupler 4 to a high frequency detecting circuit 8, which generates a detection output voltage Vout corresponding to the voltage level Va of the signal Vin. The detection output voltage Vout is supplied to a power amplified control circuit 7, and compared with a plurality of reference voltages, preset in the power amplifier control circuit 7 corresponding to the prescribed output power levels of the power amplifier 3. The power amplifier control circuit 7 supplies the power amplifier 3 with a control voltage corresponding to the result of comparison, and thereby automatically controls the output power level of the power amplifier 3, i.e. that of the transmitter. The transmitter can transmit at a maximum level of 20 W or any level selected from a plurality of output power levels with a maximum of 8 watts and having an equal difference of 2 dB.

Further referring to FIG. 1, a control signal Cont (burst ON signal) from a control signal input terminal 6 defines the "on" period and the "off" period, which is longer than the "on" period, of the transmit signal RF. h The control signal Cont, whose waveform is shown in FIG. 2, in a digital cellular telephone system conforming to the GSM standards, defines the "on" period of the transmit power to be 0.577 msec. and the "off" period of same (transmission off) to be 4.039 msec. The control signal Cont controls the power amplifier control circuit 7 and the high frequency detecting circuit 8. Thus, during the "on" period of the transmit signal RF and the high frequency signal Vin, the power amplifier control circuit 7 and the high frequency detecting circuit 8 act to control the transmission power of the power amplifier 3. Meanwhile, during the "off" period of the transmit signal RF and the high frequency signal Vin, the transmission power control circuit 7 stops the operation of the power amplifier 3, and accordingly the high frequency detecting circuit 8 is supplied with no high frequency signal Vin, but engages in storing or correction of the output voltage of the detecting diode.

Figure 3:
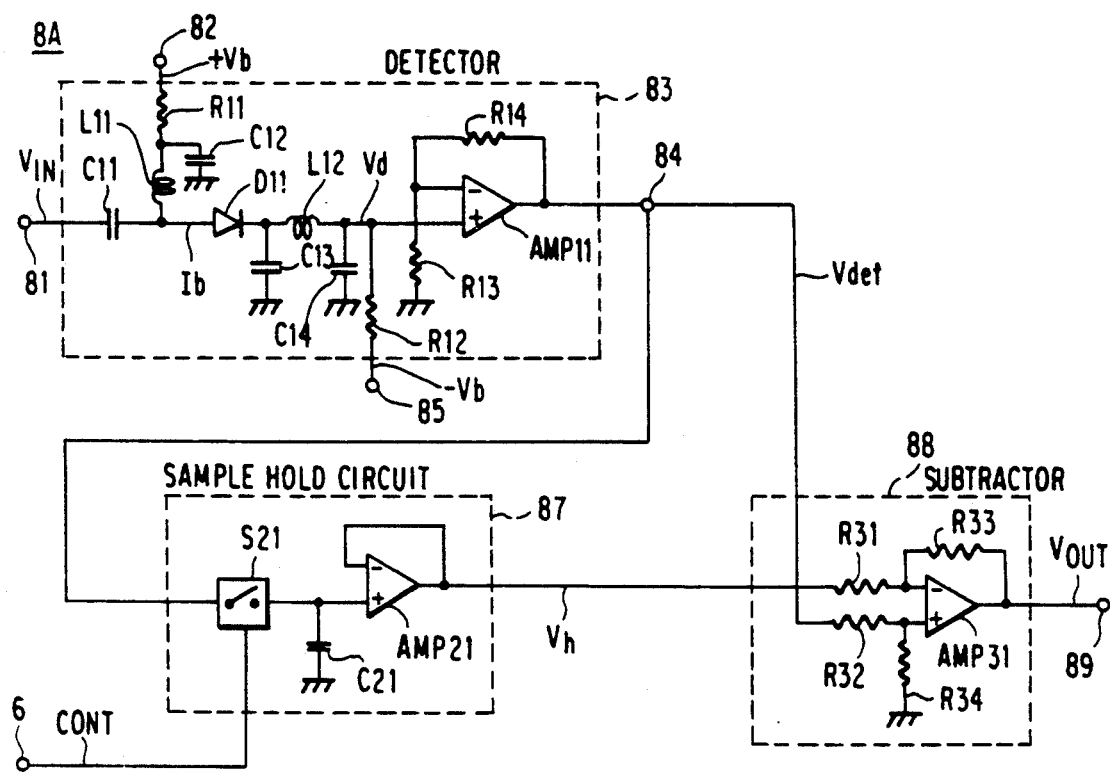
FIG. 3 is a schematic circuit diagram illustrating an RF detecting circuit constituting part of the transmitter shown in FIG. 1.

Referring to FIG. 3, into the high frequency input terminal 81 of a high frequency detecting circuit 8A, which is a first example of the high frequency detecting circuit 8 in the transmitter of FIG. 1, is entered the high frequency signal Vin, whose waveform is shown in FIG. 2. The signal Vin is detected by a detector 83 including a detecting diode D11, and the detector output voltage Vdet is supplied to an intermediate terminal 84. The detector output voltage Vdet is entered into a sample hold circuit 87, whose hold timing is controlled by the control signal Cont fed from the control signal input terminal 6 of the high frequency detecting circuit 8A. Thus, the sample hold circuit 87 intercepts the inputting of the detector output voltage Vdet during the "on" period of the transmission power, and sampleholds the detector output voltage Vdet during the "off" period of the transmission. In this way, the sample hold circuit 87 supplies the detector output voltage Vdet as a hold voltage Vh. The detector output voltage Vdet and the hold voltage Vh are entered into a subtractor 88, and the balance Vout of the subtraction of the latter from the former is supplied to the output terminal 89 of the high frequency detecting circuit 8A. This high frequency detection output voltage Vout is linearly proportional to the voltage level Va during the "on" period of the RF signal.

The value of the detection output voltage Vout varies during the "off" and "on" periods of the high frequency signal Vin under the influence of forward voltage Vf of the detecting diode D11 with temperature fluctuation. However, since the temperature fluctuation between the "off" period and the immediately following "on" period is extremely small, the detector output voltage Vdet and the hold voltage Vh supplied to the subtractor 88 will be regarded as being detected under a common temperature condition. Since the substraction of the voltage Vh from the voltage Vdet by the subtractor 88 cancels the variant contained in the voltage Vdet due to the temperature fluctuation of the diode D11, the detection output voltage Vout faithfully represents the voltage level Va of the high frequency signal Vin.

In the above-described high frequency detecting circuit 8A, the detector 83 includes a smoothing circuit comprised of a capacitor C11 supplied with the high frequency signal Vin, the detecting diode D11 connected in series to the capacitor C11, capacitors C13 and C14, and a choke coil L12. At the output end of the choke coil L12 is generated a D.C. voltage Vd proportional to the voltage Va. This D.C. voltage Vd is amplified by a D.C. amplifier comprised of resistors R13 and R14 and an arithmetic amplifier AMP11 to become the detector output voltage Vdet. If the voltage level Va is sufficiently greater than the forward voltage Vf of the diode D11, the detection of the high frequency signal by the detector 83 will be linear, and give a detector output voltage Vdet substantially proportional to the voltage Va. However, if the voltage Va is equivalent to or less than the detector output voltage Vdet, detection by the detector 83 will greatly deviate from linearity on account of the non-linearity of the forward characteristic of the detecting diode D11, resulting in a narrowed dynamic range. In the detector 83, a bias current Ib substantially corresponding to the forward voltage of the detecting diode D11 is fed to the diode D11 to alleviate the non-linearity. To the diode D11, the bias current Ib flows in the direction from a positive bias terminal 82 to a negative bias terminal 85 via a resistor R11, choke coils L11 and L12, and another resistor R12. The bias voltages +Vb and −Vb and the resistances of the resistors R11 and R12 initially set so that the bias current Ib reduces the D.C. voltage Vd to 0 V during the "off" period of the high frequency signal Vin. The D.C. voltage Vd need not be initially set to 0 V, and is variable with temperature fluctuation after the initial setting. In the detector 83, by setting the bias current Ib of the detecting diode D11, the non-linearity of the forward characteristic of the diode D11 can be alleviated to give a broad dynamic range.

In the high frequency detecting circuit 8A, the sample hold circuit 87, which is supplied with the detector output voltage Vdet from the detector 83 via the intermediate terminal 84, is provided with an analog switch S21 which turns on and off in response to the control signal Cont from the control signal input terminal 6, a differential amplifier AMP21 having a gain 1 and receiving a signal from the switch S21 at its non-inverting terminal (the output terminal is connected to its inverting terminal), and a capacitor C21 inserted between the non-inverting terminal and ground. The switch S21, when the control signal Cont is off (corresponding to the "off" period of the high frequency power amplifier output), feeds the detector output voltage Vdet to the amplifier AMP21, and supplies the voltage Vdet to the subtractor 88 in the form of a hold voltage Vh. Meanwhile, when the control signal Cont is on (corresponding to the "on" period of the high frequency amplifier output), the analog switch S21 opens with the result that the detector output voltage Vdet is stored in the capacitor C21 as the hold voltage Vh. Therefore, throughout the "on" period, the amplifier AMP21 keeps on supplying as the hold voltage Vh the detector output voltage Vdet of the immediately preceding "off" period to the subtractor 88. Thus, the hold voltage Vh from the sample hold circuit 87 is always substantially equal to the detector output voltage Vdet of the "off" period, and its value is updated in every on/off cycle of the control voltage Cont.

Now, the above-described subtractor 88 comprises a differential amplifier AMP31, and resistors R31, R32, R33 and R34. The detector output voltage Vdet from the detector 83 via the intermediate terminal 84 is fed to the non-inverting terminal of the amplifier AMP31 via the resistor R32, while the hold voltage Vh from the sample hold circuit 87 is fed to the inverting terminal of the amplifier AMP31 via the resistor R31. The amplifier AMP31 subtracts the hold voltage Vh from the detector output voltage Vdet, and supplies the detection output voltage Vout to the output terminal 89.

During the "off" period of the high frequency signal Vin, the detector output voltage Vdet is at the level of the detection voltage of said "off" period, and the hold voltage Vh also is at the level of the detector output voltage of said "off" period, so that the detection output voltage Vout is zero. Meanwhile, during the "on" period of the high frequency signal Vin, from the detector output voltage Vdet of that period is subtracted the hold voltage Vh, which is equal to the detector output voltage Vdet of the "off" period immediately preceding that "on" period, and the balance of this subtraction becomes the detection output voltage Vout.

Since, as described above, the detector output voltage Vdet of the "off" period is subtracted from that of the "on" period in the high frequency detecting circuit 8A, the influence of any variation in the forward voltage Vf of the detecting diode D11 due to temperature fluctuation can be almost completely cancelled. Moreover, as the detector 83 requires only one diode, which is for the detecting purpose, the manufacturing cost can be reduced compared with the prior art described earlier, in which unevenness of the forward voltages Vf of two diodes should be taken into account. It is also made possible to prevent the deterioration in the detecting accuracy of the high frequency signal level attributable to temperature fluctuation, which is inevitable in a circuit using two diodes. Furthermore, as adequate operating rates can be ensured for the sampling-holding action of the detector output voltage Vdet and the operation to subtract the hold voltage Vh from the detector output voltage Vdet, the detection output voltage Vout can be obtained with a high fidelity and in quick response. Therefore, the high frequency detecting circuit 8A can effectively serve as the output level control circuit of the power amplifier for a high speed transmitter of the TDMA/GSM system.

Figure 4:
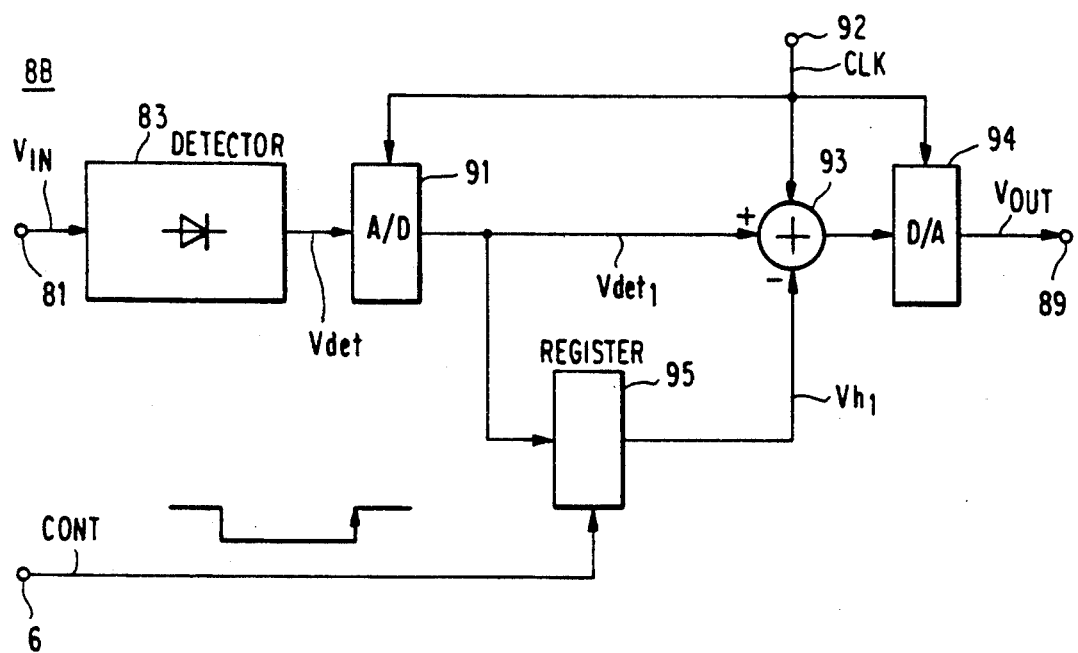
FIG. 4 is a circuit diagram illustrating another example of an RF detecting circuit used in the FIG. 1 transmitter.

Incidentally, a circuit including the sample hold circuit 87, the subtractor 88, and the smoothing circuit and the D.C. amplifier of the detector 83 is available in an integrated form as part of the μPC3593 type IC (manufactured by NEC Corporation, Tokyo, Japan). The use of this IC and a circuit including the high frequency detecting circuit 8A makes it possible to control the transmission power of the transmitter, which has a maximum power output of 8W and whose output can be set at any of 16 levels (FIG. 1), with a tolerance of ±1 dB within the temperature range of −30° C. to +85° C. e Referring now to FIG. 4, a high frequency detecting circuit 8B, which is a second example of the high frequency detecting circuit 8 in the transmitter of FIG. 1, realizes the same functions as those of the above-described high frequency detecting circuit 8A with a digital circuit (except for the detector 83). In this high frequency detecting circuit 8B, the high frequency signal entered into the high frequency input terminal 81 is turned into the detector output voltage Vdet by the detector 83, and further converted into a digital detector output voltage Vdet1 by an analog-to-digital (A/D) converter 91. The digital detector output voltage Vdet1 is entered into a register 95 for sampling and holding the input at every leading edge of the "on" period defined by the control signal Cont from the control signal input terminal 6. A sampled-held hold voltage signal Vh1 is inputted to the minus terminal of a subtractor 93. The subtractor 93 is supplied with the digital detector output voltage Vdet1 at its plus terminal, subtracts the hold voltage signal Vh1 from the digital detector output voltage Vdet1, and supplies a differential voltage signal, which is the balance of the subtraction, to a digital-to-analog (D/A) converter 94. The D/A converter 94 converts the differential voltage signal into a analogized detection output Vout, and supplies it to the output terminal 89. The A/D converter 91, the register 95, the subtractor 93 and the D/A converter 94 are supplied with a common clock CLK from a clock input terminal 92. The register 95 and the subtractor 93 respectively operate in the same ways as the sample hold circuit 87 and the subtractor 88 in the above-described high frequency detecting circuit 8A. Thus, the detector output voltage Vdet1 during said "off" period is subtracted from the detector output voltage Vdet1 during said "on" period, and a voltage Va cleared of the influence of temperature fluctuation on the forward voltage Vf of the detecting diode D11 can be detected. The high frequency detecting circuit 8B, composed of digital circuit components except the detector 83, has the advantage of readily permitting integration.

Figure 5:
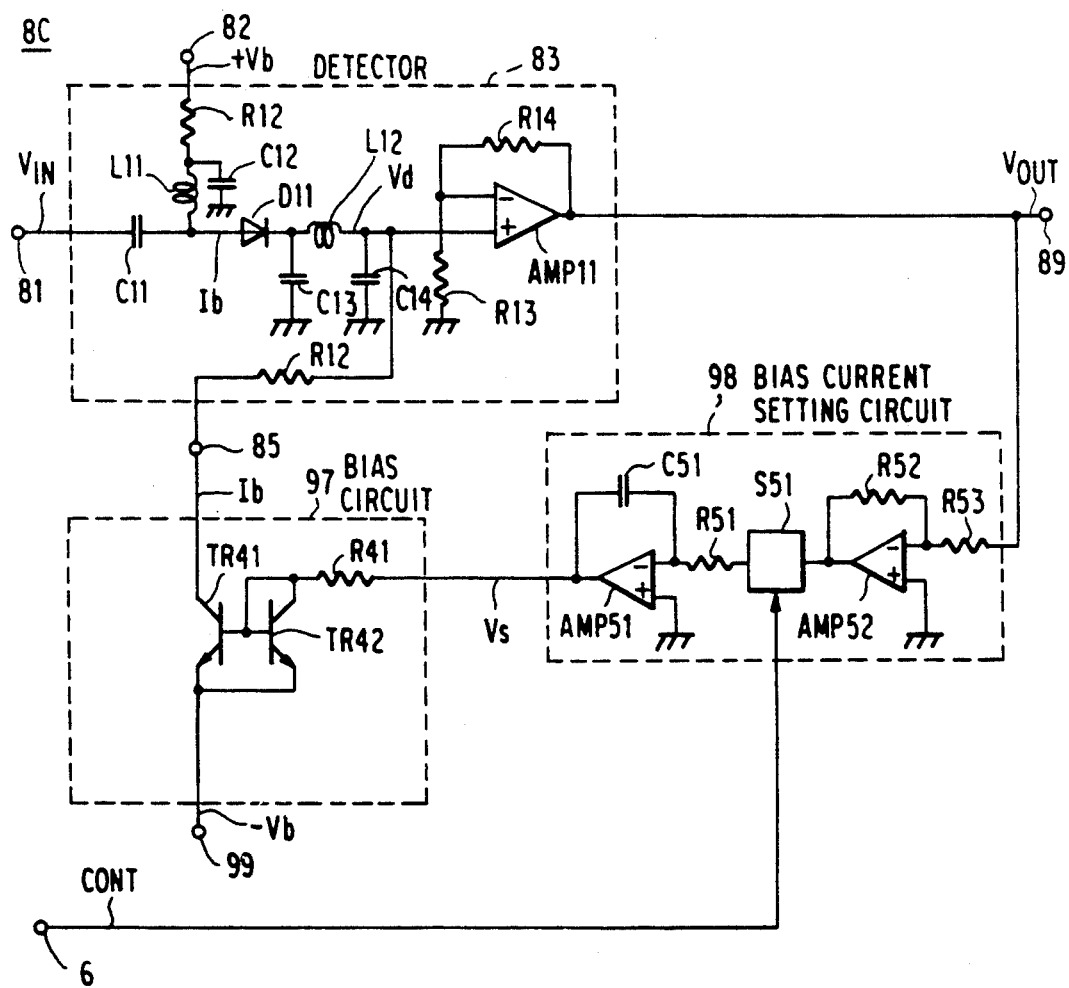
FIG. 5 is a circuit diagram illustrating still another example of an RF detecting circuit used in the FIG. 1 transmitter.

Referring to FIG. 5, a high frequency detecting circuit 8C, which is a third example of the high frequency detecting circuit 8 in the transmitter of FIG. 1, receives the high frequency signal Vin at the input terminal 81, detects it with the detector 83 and generates the detector output voltage Vout similarly to the above-described circuits 8A and 8B. In the detecting circuit 8C, unlike in the cases of the circuits 8A and 8B above, the detector output voltage Vdet obtained at the output end of the detector 83 is directly used as the detection output voltage Vout. To the negative bias terminal 85 of the detector 83 is connected a bias circuit 97, which supplies a bias current Ib to the detecting diode D11 in accordance with the potential difference between the positive bias terminal 82 and the bias circuit 97. The amperage of the bias current Ib is controlled by a bias current setting circuit 98. During the "off" period of the high frequency signal Vin corresponding to the "off" period of the high frequency power amplifier output, the high frequency detecting circuit 8C constitutes a negative feedback loop, and so adjusts the amperage of the bias current Ib with the feedback loop as to set the detection output voltage Vout at a prescribed value, preferably at 0 V. Meanwhile, during the "on" period immediately following the above "off" period, the bias current setting circuit 98 controls the bias circuit 97 so as to cause the bias circuit 97 to continue the bias current Ib of the "off" period. The bias current Ib is thereby corrected at every beginning of the "off" period of the high frequency Vin, and the detection output voltage Vout of the "on" period is definitely determined as an increment from the detection output voltage Vout of the prescribed value for the "off" period. As a result, the high frequency detecting circuit 8C can prevent the detection output from being varied by the influence of temperature fluctuation on the detecting diode D11 or by the unevenness of the constants of the circuit elements of the detector 83.

In the high frequency detecting circuit 8C of FIG. 5, the bias circuit 97 comprises a current mirror circuit consisting of transistors TR41 and TR42 whose respective bases and emitters are commonly connected and a resistor R41. The collector of the transistor TR41 is connected to the negative bias terminal 85 of the detector 83. The bases of transistors TR41 and TR42 are connected to the output end of the bias current setting circuit 98 via the resistor R41. The collector current of the transistor TR41, i.e. the bias current Ib of the detecting diode D11, is substantially equal to the collector current of the transistor TR41 and dependent on the resistance of the resistor R41 and on the output voltage Vs of the bias current setting circuit 98, decreasing with a variation in the output voltage Vs in the negative direction and with an increase in the resistance of the resistor R41. The bias current Ib flows to a circuit having the resistor R12, the transistor TR41 and a negative bias terminal 99, to which the bias voltage −Vb is fed.

Further in the high frequency detecting circuit 8C of FIG. 5, the bias current setting circuit 98 is comprised of an inverting amplifier having differential amplifier AMP52 and resistors R52 and R53. The inverting amplifier inverts the polarity of the detection output voltage Vout, which is the output of the detector 83. The polarity-inverted detection output voltage is supplied to an analog switch S51, which is so controlled with the control signal Cont from the control signal input terminal 6 as to be closed during the "off" period of the high frequency power amplifier output and open during the "on" period of same. The (polarity-) inverted detection output voltage from the switch S51 is fed to an integrating circuit including a differential amplifier AMP51, a resistor R51 and a capacitor C51. The output voltage Vs of the integrating circuit, which varies in the negative direction with an increase in the detection output voltage Vout in the positive direction, is supplied to the bias circuit 97. Meanwhile, when the control signal Cont is on for transmission, the analog switch S51 is open and the inverted output voltage is not fed to the integrating circuit, so that the output voltage Vs of the immediately preceding "off" period is supplied to the bias circuit 97.

As hitherto described the high frequency detecting circuit according to the present invention, which is suitable for detecting the level of intermittent high frequency signals in the output level control circuit of a high frequency power amplifier, determines in reference to each detector output in the "off" period of the high frequency power amplifier output the level in the "on" period of the same output as an increment from the corresponding reference level. Accordingly, the high frequency detecting circuit makes it possible to require no more than one diode, which is an indispensable circuit element for level detection and whose characteristics are apt to be changed by temperature fluctuation, and moreover any such change in detection output due to temperature fluctuation is substantially cancelled by the subtraction of the level during the "off" period from that during the "on" period, resulting in a level of high fidelity. Furthermore, since the high frequency detecting circuit requires no high frequency diode for temperature compensation, which is indispensable for this kind of prior art circuit, it is not only free from the need to adjust the bias offset but also suitable for integration. Therefore, the output level control circuit according to the invention for a high frequency power amplifier is highly suitable as a control circuit for the transmitter of a TDMA or GSM communication system using intermittent high frequency signals.

What is claimed is:

1. An apparatus comprising:
    power amplifier means responsive to a first control signal for amplifying a high frequency signal to produce an amplified signal;
    high frequency power extracting means for taking out part of said amplified signal to produce an extracted signal;
    detecting means responsive to a second control signal having "on" and "off" periods in a recurrent cycle for detecting said extracted signal to produce, for each of said cycles, a control voltage representing a voltage difference between said extracted signals taken out during one "on" period of said second control signal and an "off" period immediately preceding said one "on" period, respectively; and
    control circuit means responsive to said control voltage and to said second control signal for producing and supplying said first control signal to said power amplifier.

2. An apparatus as claimed in claim 1, wherein said detecting means comprises a detecting diode.

3. An apparatus as claimed in claim 1, wherein said detecting means comprises a sample hold circuit for sampling-holding the output of said detecting diode during said "off" period for each of said recurrent cycles; and
   means for subtracting the output of said sample hold circuit from the output of said detecting diode in each of said recurrent cycles.

4. An apparatus as claimed in claim 1, wherein said detecting means comprises:
   a smoothing circuit for smoothing the output of said detecting diode; and
   an amplifier for amplifying the output of said smoothing circuit.

5. An output level control circuit for use in a high frequency power amplifier responsive to a control signal having "on" and "off" periods in a recurrent cycle for amplifying an intermittent high frequency signal having a waveform corresponding to said control signal and supplying them to an antenna, comprising high frequency power extracting means for taking out part of the output of said high frequency power amplifier, and a high frequency detecting circuit responsive to the output of said extracting means and said control signal for generating a detection output representing the high of said waveform, wherein:
   said high frequency detecting circuit comprises detecting means supplied with said high frequency signal and generating an output representing the level of said high frequency signal;
   means for analog-to-digital (A/D) converting the output of said detecting means;
   signal accumulating means for accumulating the output of said A/D converting means corresponding to the output of said detecting means during each of said "off" periods and supplying the accumulated output of said A/D converting means at the beginning of the "on" period immediately following that "off" period; and
   means for subtracting the output of said signal accumulating means from the output of said A/D converting means in each of said recurrent cycles.

6. A high frequency detecting circuit, in an output level control circuit for use in a high frequency power amplifier responsive to a control signal having "on" and "off" periods in a fixed recurrent cycle for amplifying an intermittent high frequency signal having a waveform corresponding to said control signal and supplying them to an antenna, responsive to an extracted output from high frequency power extracting means, which takes out part of the output of said high frequency power amplifier, and said control signal for generating a detection output representing the height of said waveform and supplying that detection output to amplitude control means for controlling the amplitude of said high frequency power amplifier,
   said high frequency detecting circuit comprising:
   detecting means supplied with said high frequency signal and generating an output representing the level of said high frequency signal; and
   differential voltage generating means for generating, for each of said recurrent cycles, a voltage representing the difference between the output of said detecting means during one "on" period and the output of said detecting means during an "off" period immediately preceding said one "on" period.

7. A high frequency detecting circuit, as claimed in claim 6, wherein said detecting means comprises a detecting diode.

8. A high frequency detecting circuit, as claimed in claim 6, wherein said differential voltage generating means comprises a sample hold circuit for sampling-holding the output of said detecting means during said "off" period for each of said recurrent cycles and supplying the output of said detecting means, which has been so sampled and held, during said "off" period and the immediately following "on" period, and
   means for subtracting the output of said sample hold circuit from the output of said detecting means in each of said recurrent cycles.

9. A high frequency detecting circuit, as claimed in claim 6, wherein said detecting means comprises a diode for generating a voltage representing said level of said high frequency signal,
   a smoothing circuit connected to the output of said diode, and
   an amplifier for amplifying the output of said smoothing circuit.

10. A high frequency detecting circuit, in an output level control circuit for use in a high frequency power amplifier responsive to a control signal having "on" and "off" periods in a fixed recurrent cycle for amplifying an intermittent high frequency signal having a waveform corresponding to said control signal and supplying them to an antenna, responsive to an extracted output from high frequency power extracting means, which takes out part of the output of said high frequency power amplifier, and said control signal for generating a detection output representing the height of said waveform and supplying that detection output to amplitude control means for d controlling the amplitude of said high frequency power amplifier, wherein:
   said high frequency detecting circuit comprises detecting means supplied with said high frequency signal and generating an output representing the level of said high frequency signal;
   means for analog-to-digital (a/D) converting the output of said detecting means;
   signal accumulating means for accumulating the output of said A/D converting means corresponding to the output of said detecting means during each of said "off" periods and supplying the accumulated output of said A/D converting means at the beginning of the "on" period immediately following that "off" period; and
   means for subtracting the output of said signal accumulating means from the output of said A/D converting means in each of said recurrent cycles.

11. An apparatus comprising:
   power amplifier means responsive to a first control signal for amplifying a high frequency signal to produce an amplified signal;
   high frequency power extracting means for taking out part of said amplified signal to produce an extracted signal;
   detecting means responsive to a second control signal having "on" and "off" periods in a recurrent cycle for detecting said extracted signal to produce, for each of said cycles, a control voltage, said detecting means including a detecting diode;
   means for placing the output of said detecting means at a prescribed voltage during said "off" period and supplying said detecting diode with a forward bias current having a magnitude corresponding to said prescribed voltage during said "on" period; and control circuit means responsive to said control voltage and to said control signal for producing and supplying said first control signal to said power amplifier.

12. An apparatus as claimed in claim 11, wherein the amperage of said forward bias current is set in reference to the output voltage of said detecting means during said "off" period.

13. A high frequency detecting circuit, in an output level control circuit for use in a high frequency power amplifier responsive to a control signal having "on" and "off" periods in a fixed recurrent cycle for amplifying an intermittent high frequency signal having a waveform corresponding to said control signal and supplying the amplified signal to an antenna, responsive to an extracted output from high frequency power extracting means, which takes out part of the output of said high frequency power amplifier, and said control signal for generating a detection output representing the height of said waveform and supplying that detection output to amplitude control means for controlling the amplitude of the output of said high frequency power amplifier, said high frequency detecting circuit comprising detecting means supplied with said high frequency signal and generating an output representing the level of said high frequency signal, said detecting means includes: a detecting diode; and means for placing the output of said high frequency detecting circuit at a prescribed voltage during said "off" period and supplying said detecting diode with a forward bias current of a magnitude corresponding to said prescribed voltage during said "on" period.

14. A high frequency detecting circuit, as claimed in claim 13, wherein the amperage of said forward bias current is set in reference to the output voltage of said high frequency detecting circuit during said "off"-'period.

* * * * *